United States Patent
Bao et al.

(10) Patent No.: US 10,412,843 B2
(45) Date of Patent: *Sep. 10, 2019

(54) DISPLAY PANEL ASSEMBLY AND MANUFACTURING METHOD THEREOF

(71) Applicant: GUANGDONG OPPO MOBILE TELECOMMUNICATIONS CORP., LTD., Dongguan, Guangdong (CN)

(72) Inventors: Xiaoming Bao, Dongguan (CN); Maozhao Huang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/799,164

(22) Filed: Oct. 31, 2017

(65) Prior Publication Data
US 2018/0199448 A1    Jul. 12, 2018

(30) Foreign Application Priority Data

Jan. 9, 2017  (CN) .......................... 2017 1 0013751
Jan. 9, 2017  (CN) ..................... 2017 2 0022983 U (51) Int. Cl.
*H05K 5/00* (2006.01)
*G06F 1/16* (2006.01)
(Continued)

(52) U.S. Cl.
CPC ......... *H05K 5/0017* (2013.01); *G06F 1/1637* (2013.01); *H05K 5/0243* (2013.01);
(Continued)

(58) Field of Classification Search
CPC ...... H05K 5/0017; H05K 5/04; H05K 5/0243; H05K 5/03; G04G 9/12; G04G 9/10;
(Continued)

(56) References Cited

U.S. PATENT DOCUMENTS 6,654,078 B1 * 11/2003 Kato ................. G02F 1/133308
                                                                349/58
8,561,831 B2 * 10/2013 Liao .................. B29C 45/14336
                                                                220/4.01
(Continued)

FOREIGN PATENT DOCUMENTS

CN    102768420    11/2012
CN    202872874 U   4/2013
(Continued)

OTHER PUBLICATIONS

SIPO, First Office Action for CN Application No. 201710013751, dated Mar. 1, 2019.

*Primary Examiner* — Abhishek M Rathod
(74) *Attorney, Agent, or Firm* — Hodgson Russ LLP (57) ABSTRACT

A display panel assembly includes a support, a display panel, a cover plate, and a decorative ring. The support includes a first support component and a second support component. The second support component includes a bottom wall and a side wall bent from the bottom wall. A bottom surface of the first support component is fixed to the bottom wall. A side surface of the first support component faces the side wall. The display panel is fixed to a top surface of the first support component. The cover plate is disposed on the display panel. The decorative ring is disposed on a top end of the side wall away from the bottom wall and joined to a side of the cover plate.

18 Claims, 6 Drawing Sheets

(51) Int. Cl.
   *H05K 5/02* (2006.01)
   *H05K 5/03* (2006.01)
   *H04M 1/02* (2006.01)

(52) U.S. Cl.
   CPC ............ *H05K 5/03* (2013.01); *G06F 1/1626* (2013.01); *H04M 1/0266* (2013.01)

(58) Field of Classification Search
   CPC ...... G06F 1/1637; G06F 3/041; G06F 1/1626; G06F 1/1643; H04M 1/0266
   See application file for complete search history.

(56) References Cited

U.S. PATENT DOCUMENTS

| | | | |
|---|---|---|---|
| 2012/0281381 A1* | 11/2012 | Sanford | G06F 1/1626 361/807 |
| 2012/0281383 A1 | 11/2012 | Hwang | |
| 2013/0140965 A1* | 6/2013 | Franklin | G06F 1/1626 312/223.1 |
| 2013/0236680 A1 | 9/2013 | Ahn | |
| 2014/0177154 A1* | 6/2014 | Lee | G06F 1/1656 361/679.26 |
| 2014/0198436 A1 | 7/2014 | Lim et al. | |
| 2015/0062787 A1* | 3/2015 | Wilson | H04M 1/185 361/679.01 |
| 2015/0153782 A1* | 6/2015 | Liu | G06F 1/1656 361/679.26 |
| 2016/0109906 A1 | 4/2016 | Trutna et al. | |
| 2017/0177032 A1 | 6/2017 | Cheng | |

FOREIGN PATENT DOCUMENTS

| | | |
|---|---|---|
| CN | 104601753 A | 5/2015 |
| CN | 204376982 | 6/2015 |
| CN | 104866020 A | 8/2015 |
| CN | 204993512 U | 1/2016 |
| CN | 105376359 | 3/2016 |
| CN | 205827354 U | 12/2016 |
| CN | 106843385 A | 6/2017 |
| CN | 206363215 U | 7/2018 |

* cited by examiner

DISPLAY PANEL ASSEMBLY AND MANUFACTURING METHOD THEREOF

CROSS REFERENCE TO RELATED APPLICATIONS

This application claims priority to Chinese Application No. 201710013751.0 filed Jan. 9, 2017 and Chinese Application No. 201720022983.8 filed Jan. 9, 2017. This application is also related to a co-pending application entitled "Display Panel Assembly And Manufacturing Method Thereof" which claims priority to Chinese Application No. 201710013752.5 filed Jan. 9, 2017 and Chinese Application No. 201720022984.2 filed Jan. 9, 2017. The entire disclosures of the above applications are incorporated herein by reference.

BACKGROUND

Field

The present disclosure relates to the field of electronic devices, and particularly to a display panel assembly and a manufacturing method thereof.

Background

With the development of technologies, smart phones, having more functions, are becoming more and more popular. Smart phones have become indispensable devices in people's lives. However, a display panel assembly of an existing smart phone has relatively small panel ratio, which reduces user experience.

BRIEF DESCRIPTION OF THE DRAWINGS

The aspects and advantages of the embodiments of the present disclosure will become apparent and easily understood from the following description of the embodiments in conjunction with the accompanying drawings.

DETAILED DESCRIPTION OF ILLUSTRATED EMBODIMENTS

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present disclosure, which shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Figure 1:
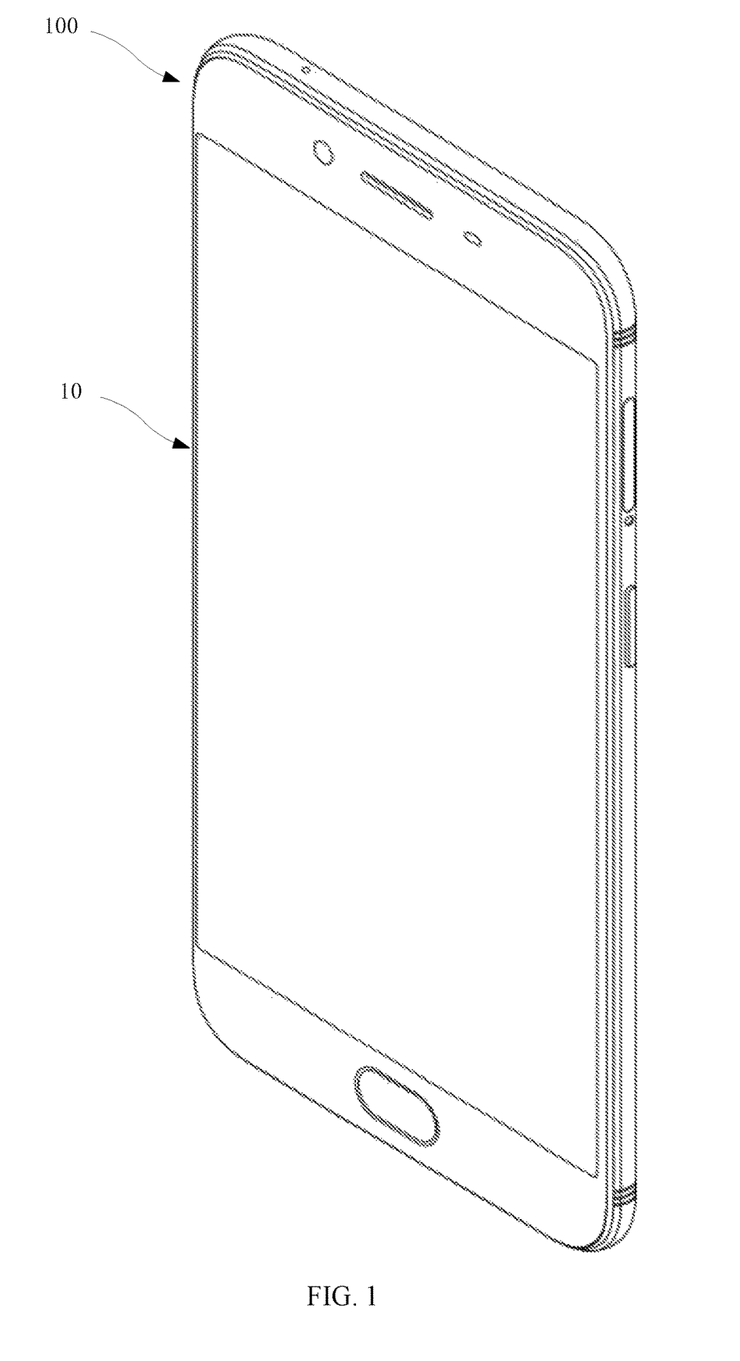
FIG. 1 is a schematic perspective view of an electronic device according to an embodiment of the present disclosure.
Figure 2:
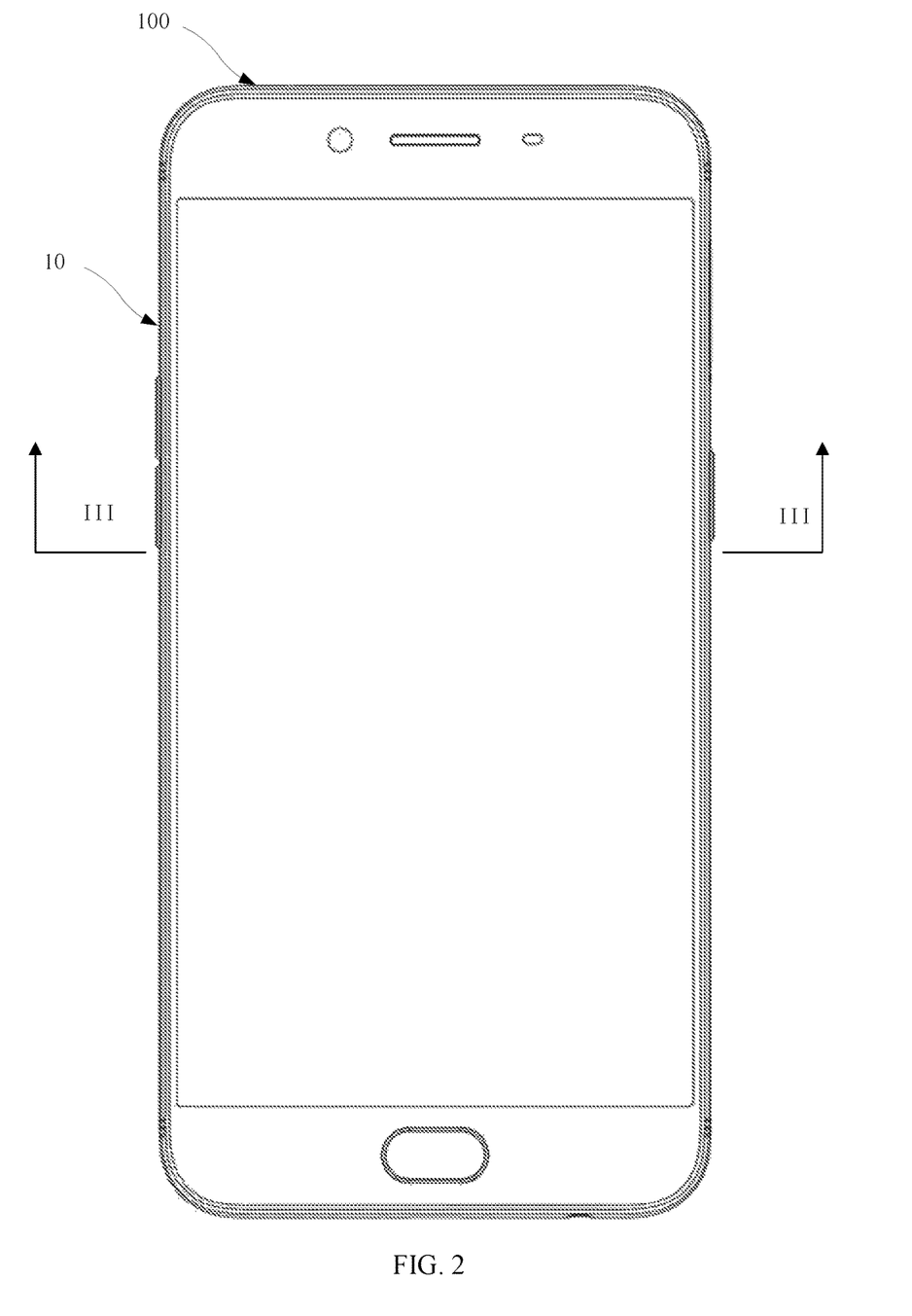
FIG. 2 is a schematic plan view of a display panel assembly according to an embodiment of the present disclosure.

Referring to FIG. 1 and FIG. 2, an electronic device 100 according to an embodiment of the present disclosure includes a display panel assembly 10. The electronic device 100 includes, but is not limited to, a mobile phone, a tablet, or a smart watch, etc.

Figure 3:
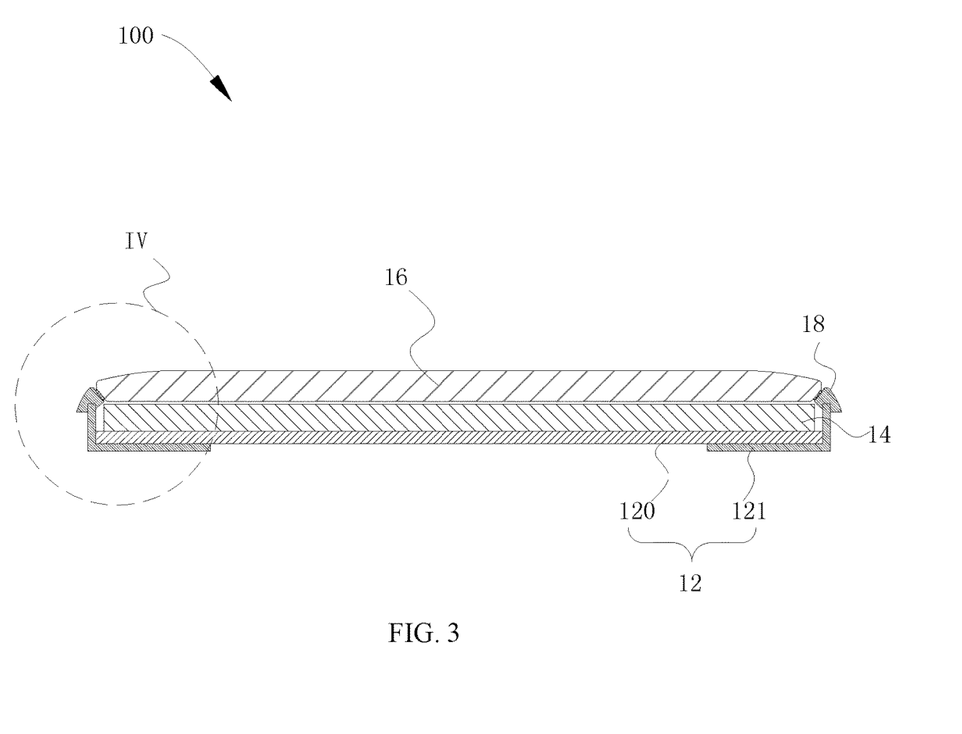
FIG. 3 is a schematic cross-sectional view of the display assembly taken along line III-III of FIG. 2.

In some embodiments, the display panel assembly 10 is configured to display an image, a text, etc., and the display panel assembly 10 may also be configured to receive a touch operation of a user. Referring to FIG. 3, the display assembly 10 includes a support 12, a display panel 14, a cover plate 16, and a decorative ring 18.

Figure 4:
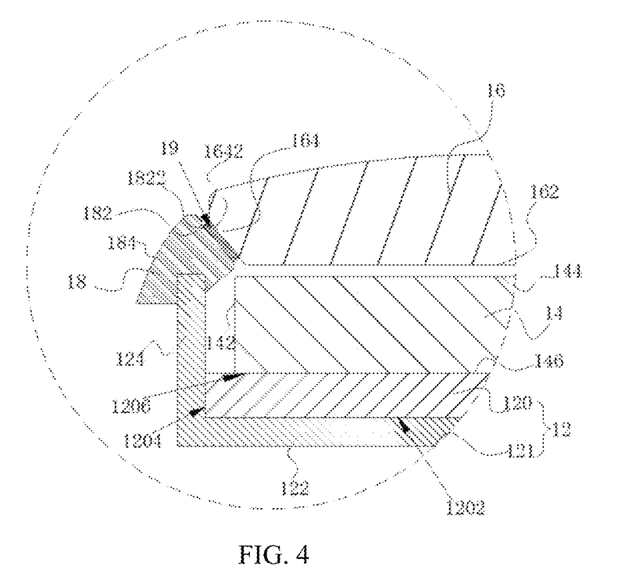
FIG. 4 is an enlarged schematic view of a portion designated IV in FIG. 3.

Referring to FIG. 3 and FIG. 4, the support 12 includes a first support component 120 and a second support component 121. The second support component 121 includes a bottom wall 122 and a side wall 124 bent from the bottom wall 122. In the embodiment of the present disclosure, the second support component 121 is an L shape. A bottom surface 1202 of the first support component 120 is fixed to the bottom wall 122 of the second support component 121, and a side surface 1204 of the first support component 120 faces the side wall 124. In the embodiment of the present disclosure, the first support component 120 is fixed to the second support component 121 by welding, and the side surface 1204 of the first support component 120 is in contact with the side wall 124. In other embodiments, the first support component 120 may be fixed to the bottom wall 122 of the second support component 121 to form the support 12 by a method selected from the group consisting of welding, gluing, threading, and engagement. In detail, a thickness of the first support component 120 ranges from greater than or equal to 0.4 mm to less than or equal to 0.5 mm, for example, 0.4 mm, 0.42 mm, 0.44 mm, 0.46 mm, 0.48 mm, or 0.5 mm, etc. A thickness of the side wall 124 of the second support component 121 is less than 0.4 mm to greater than or equal to 0.2 mm, for example, 0.2 mm, 0.25 mm, 0.28 mm, 0.30 mm, 0.34 mm, 0.39 mm, etc. Material of the support 12 may be metallic material such as steel, aluminum alloy, or magnesium alloy. In detail, in the embodiment of the present disclosure, material of the support 12 is steel, the thickness of the first support component 120 is 0.4 mm, and the thickness of the side wall 124 is 0.2 mm. In one embodiment, material of the support 12 is magnesium alloy, the thickness of the first support component 120 is 0.5 mm, and the thickness of the side wall 124 is 0.2 mm. In other embodiments, material of the support 12 may also be a non-metallic material such as acrylonitrile-butadiene-styrene (ABS) copolymer, polyvinyl chloride (PVC), or polycarbonate (PC). Material of the support 12 is not limited to the above material, and a suitable material may be selected according to the demand in practical application. The material of the first support component 120 is the same as or different from the material of the second support component 121. For example, when the first support component 120 is a metal and the second support component 121 is a metal, the first support component 120 may be steel, the second support component 121 may be steel, or the first support member 120 may be steel, and the second support component 121 is magnesium alloy. When the first support component 120 is a nonmetallic, for example, plastic, and the second support member 121 is a metal, for example, steel, the first support component 120 may be acrylonitrile-butadiene-styrene (ABS) copolymer, the second support component 121 may be steel, or the first support component 120 may be polycarbonate (PC), and the second support component 121 may be magnesium alloy.

The display panel 14 is fixed to a top surface 1206 of the first support component 120. The display panel 14 may be a liquid crystal display (LCD) panel, an organic light-emitting diode (OLED) display panel or a flexible OLED display panel. The display panel 14 includes a display area and a non-display area. The display area is configured to display an image, a text, etc. of the display panel assembly 10. A side 142 of the display panel 14 is disposed facing the side wall 124, with a gap defined therebetween.

The cover plate 16 is disposed on the display panel 14. A bottom surface 162 of the cover plate 16 and a top surface 144 of the display panel 14 can be joined in fully fitting manner. In detail, the bottom surface 162 and the top surface 144 can be joined by an optical clear adhesive (OCA). In the embodiment of the present disclosure, the cover plate 16 is a touch panel cover, that is, touch lines of a touch panel are integrated in the cover plate 16, and a touch operation can be realized by clicking on the cover plate 16. The cover plate 16 may be made of glass, sapphire, or polyvinyl chloride (PVC), etc. In some embodiments, the cover plate 16 includes a two-layer structure including a touch panel and a protective cover disposed on the touch panel. The touch panel is configured to perform a touch operation of the display panel assembly 10. The protective cover is configured to protect the touch panel from touching the touch panel to avoid direct touch operation of the touch panel.

The decorative ring 18 is disposed on the support 12, material of the decorative ring 18 is plastic, and the decorative ring 18 is joined to the support 12 by an in-mold injection molding process. The decorative ring 18 is disposed on a top end of the side wall 124 away from the bottom wall 122 and is joined to a side 164 of the cover plate 16. An inner wall 182 of the decorative ring 18 includes a first joining surface 1822, the side 164 of the cover plate 16 includes a second joining surface 1642 facing the first joining surface 1822, and the first joining surface 1822 and the second joining surface 1642 are inclined with respect to the side wall 124. In other words, the first joining surface 1822 and the second joining surface 1642 are inclined planes. The decorative ring 18 is joined to the side 164 of the cover plate 16 by gluing. In detail, the decorative ring 18 is joined to the side 164 of the cover plate 16 by dispensing a glue 19 to the side 164 of the cover plate 16. The glue 19 may be a gluewater, a solid glue, an ultraviolet curing glue, etc. An end of the first joining surface 1822 is closer to the display panel 14 relative to the side wall 124, that is, the first joining surface 1822 of the decorative ring 18 extends beyond the side wall 124 such that there is a gap between the display panel 14 and the side wall 124. An outer wall 184 of the decorative ring 18 has a curved arc shape. It is to be understood that the decorative ring 18 may be disposed around the side 164 of the cover plate 16.

In the display panel assembly 10 of the embodiment of the present disclosure, the first support component 120 and the second support component 121 having L shape are welded to form the support 12, and the thickness of the second support component 121 having L shape is less than the thickness of the first support 120, so as to satisfy requirements of strength and rigidity of the support 12, and the thickness of the side wall 124 is reduced. When the display panel assembly 10 of the embodiment of the present disclosure is applied to the electronic device 100, entire width of the electronic device 100 is reduced.

In the display panel assembly 10 of the embodiment of the present disclosure, the first support component 120 and the second support component 121 having L shape are welded to form the support 12, and then the support 12 is subjected to an in-mold injection molding process, the decorative ring 18 is joined to the support 12, and then the second joining surface 1642 of the cover plate 16 and the first joining surface 1822 of the decorative ring 18 are joined by dispensing the glue. The display panel 14 and the cover plate 16 fully fitted to each other are disposed on the support 12, and a bottom surface 146 of the display panel 14 is joined to the top surface 1206 of the first support component 120 by gluing to form the display panel assembly 10. It is to be understood that the display panel 14 may be disposed on the support 12, and then the display panel 14 and the cover plate 16 are fully fitted.

The electronic device 100 according to the embodiment of the present disclosure can reduce entire width, save space and facilitate user operation by reducing the thickness of the side wall 124 of the support 12 of the display panel assembly 10 on one hand. It can also be achieved without increasing the entire width of the premise, increase size of the display to improve the panel ratio, to bring users a better experience of the operation on another hand.

Further, the decorative ring 18 is joined to the support 12 by the in-mold injection molding process. The in-mold injection molding process allows the decorative ring 18 to be better fitted with the support 12. The first joining surface 1822 and the second joining surface 1642 are inclined with respect to the side wall 124 to reduce horizontal widths and facilitate narrowing the width of the display panel assembly 10. The first joining surface 1822 and the second joining surface 1642 are joined by dispensing the glue, and the width required for the dispensing is small, and entire size of the electronic device 100 is made smaller.

Further, the first support component 120 and the second support component 121 having L shape are welded together to form the support 12, this molding method can reduce the thickness of the side wall 124 while ensuring that strength and rigidity of the support 12 meet the requirements. The material of the support 12 is metallic material, since mechanical properties of the metallic material are superior to those of ordinary plastics. The strength and rigidity of the support 12 can be increased, and the thickness of the support 12 can be reduced, thereby reducing entire volume of the electronic apparatus 100.

Figure 5:
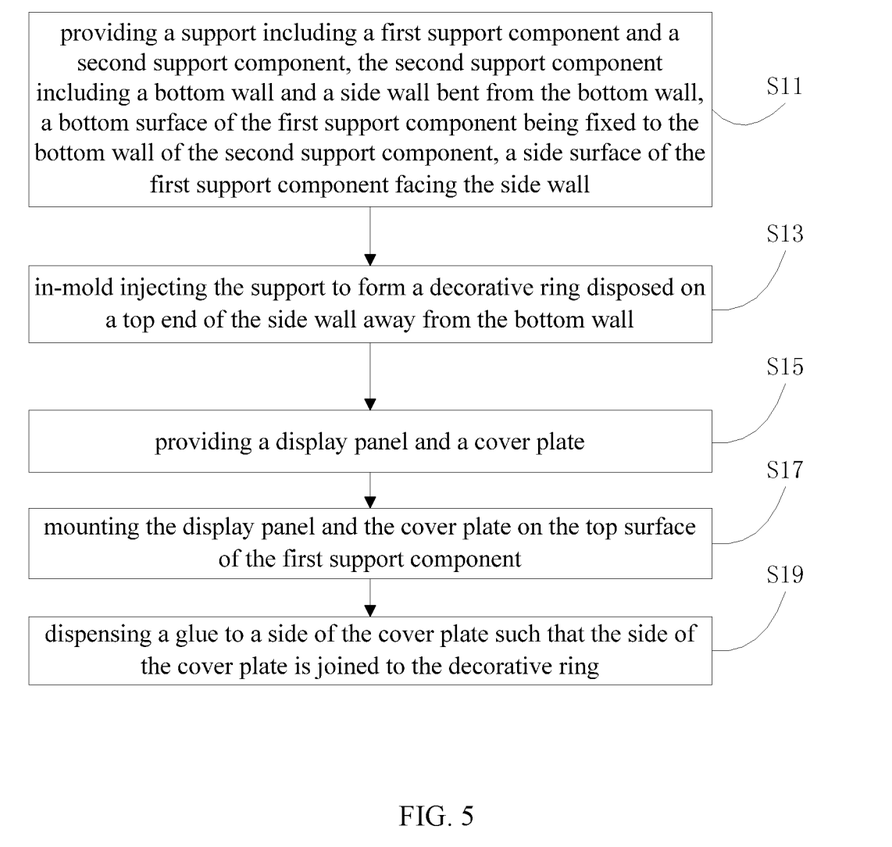
FIG. 5 is a flowchart illustrating a manufacturing method according to some embodiments of the present disclosure.

Referring to FIG. 4 and FIG. 5, a manufacturing method of an embodiment of the present disclosure for manufacturing the display panel assembly 10 includes following blocks:

In block S11: providing a support 12 including a first support component 120 and a second support component 121, the second support component 121 including a bottom wall 122 and a side wall 124 bent from the bottom wall 122, a bottom surface 1202 of the first support component 120 being fixed to the bottom wall 122 of the second support component 121, a side surface 1204 of the first support component 120 facing the side wall 124 of the second support component 121.

In block S13: in-mold injecting the support 12 to form a decorative ring 18 disposed on a top end of the side wall 124 of the second support component 121 away from the bottom wall 122 of the second support component 121.

In block S15: providing a display panel 14 and a cover plate 16.

In block S17: mounting the display panel 14 and the cover plate 16 on the top surface 1206 of the first support component 120.

In block S19: dispensing a glue to a side 164 of the cover plate 16 such that the side 164 of the cover plate 16 is joined to the decorative ring 18.

In the embodiment of the present disclosure, the first support component 120 is fixed to the second support component 121 by welding, and the side surface 1204 of the first support component 120 is in contact with the side wall 124. In other embodiments, the first support component 120 may be fixed to the bottom wall 122 of the second support component 121 to form the support 12 by a method selected from the group consisting of welding, gluing, threading, and engagement. In detail, a thickness of the first support component 120 ranges from greater than or equal to 0.4 mm to less than or equal to 0.5 mm, for example, 0.4 mm, 0.42 mm, 0.44 mm, 0.46 mm, 0.48 mm, or 0.5 mm, etc. A thickness of the side wall 124 of the second support component 121 is less than 0.4 mm to greater than or equal to 0.2 mm, for example, 0.2 mm, 0.25 mm, 0.28 mm, 0.30 mm, 0.34 mm, 0.39 mm, etc. Material of the support 12 may be metallic material such as steel, aluminum alloy, or magnesium alloy. In detail, in the embodiment of the present disclosure, material of the support 12 is steel, the thickness of the first support component 120 is 0.4 mm, and the thickness of the side wall 124 is 0.2 mm. In one embodiment, material of the support 12 is magnesium alloy, the thickness of the first support component 120 is 0.5 mm, and the thickness of the side wall 124 is 0.2 mm. In other embodiments, material of the support 12 may also be a non-metallic material such as acrylonitrile-butadiene-styrene (ABS) copolymer, polyvinyl chloride (PVC), or polycarbonate (PC). Material of the support 12 is not limited to the above material, and a suitable material may be selected according to the demand in practical application. The material of the first support component 120 is the same as or different from the material of the second support component 121. For example, when the first support component 120 is a metal and the second support component 121 is a metal, the first support component 120 may be steel, the second support component 121 may be steel, or the first support member 120 may be steel, and the second support component 121 is magnesium alloy. When the first support component 120 is a nonmetallic, for example, plastic, and the second support member 121 is a metal, for example, steel, the first support component 120 may be acrylonitrile-butadiene-styrene (ABS) copolymer, the second support component 121 may be steel, or the first support component 120 may be polycarbonate (PC), and the second support component 121 may be magnesium alloy.

Figure 6:
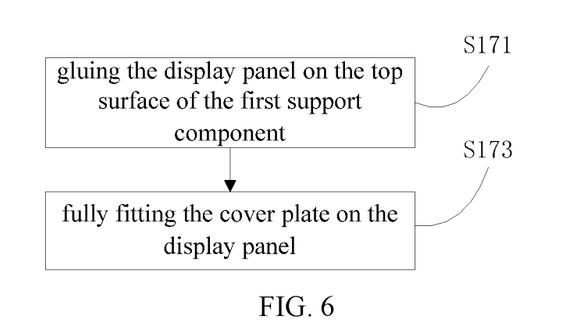
FIG. 6 is a flowchart illustrating a manufacturing method according to some embodiments of the present disclosure.

In conjunction with FIG. 6, in some embodiments, block S17 includes following blocks:

In block S171: gluing the display panel 14 on the top surface 1206 of the first support component 120.

In block S173: fully fitting the cover plate 16 on the display panel 14.

An inner wall 182 of the decorative ring 18 includes a first joining surface 1822, the side 164 of the cover plate 16 includes a second joining surface 1642 facing the first joining surface 1822, and the first joining surface 1822 and the second joining surface 1642 are inclined with respect to the side wall 124. In other words, the first joining surface 1822 and the second joining surface 1642 are inclined planes. The decorative ring 18 is joined to the side 164 of the cover plate 16 by gluing. In detail, the decorative ring 18 is joined to the side 164 of the cover plate 16 by dispensing a glue 19 to the side 164 of the cover plate 16. The glue 19 may be a gluewater, a solid glue, an ultraviolet curing glue, etc. An end of the first joining surface 1822 is closer to the display panel 14 relative to the side wall 124, that is, the first joining surface 1822 of the decorative ring 18 extends beyond the side wall 124 such that there is a gap between the display panel 14 and the side wall 124.

The manufacturing method of the embodiment of the present disclosure can reduce entire width, save space and facilitate user operation by reducing the thickness of the side wall 124 of the support 12 of the display panel assembly 10 on one hand. It can also be achieved without increasing the entire width of the premise, increase size of the display to improve the panel ratio, to bring users a better experience of the operation on another hand.

Further, the decorative ring 18 is joined to the support 12 by the in-mold injection molding process. The in-mold injection molding process allows the decorative ring 18 to be better fitted with the support 12. The first joining surface 1822 and the second joining surface 1642 are inclined with respect to the side wall 124 to reduce horizontal widths and facilitate narrowing the width of the display panel assembly 10. The first joining surface 1822 and the second joining surface 1642 are joined by dispensing the glue, and the width required for the dispensing is small, and entire size of the electronic device 100 is made smaller.

Further, the first support component 120 and the second support component 121 having L shape are welded together to form the support 12, this molding method can reduce the thickness of the side wall 124 while ensuring that strength and rigidity of the support 12 meet the requirements. The material of the support 12 is metallic material, since mechanical properties of the metallic material are superior to those of ordinary plastics. The strength and rigidity of the support 12 can be increased, and the thickness of the support 12 can be reduced, thereby reducing entire volume of the electronic apparatus 100.

Figure 7:
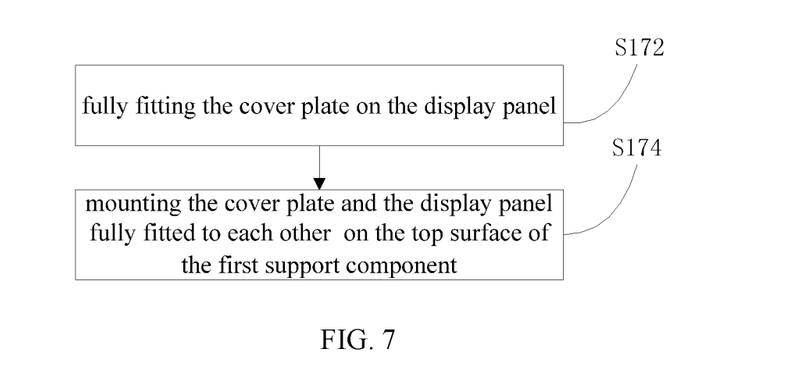
FIG. 7 is a flowchart illustrating a manufacturing method according to some embodiments of the present disclosure.

In conjunction with FIG. 7, in some embodiments, block S17 includes following blocks:

In block S172: fully fitting the cover plate 16 on the display panel 14.

In block S174: mounting the cover plate 16 and the display panel 14 fully fitted to each other on the top surface 1206 of the first support component 120.

It is to be understood that the display panel 14 may be glued to the top surface 1206 of the first support component 120 and then the cover plate 16 is fully fitted on the display panel 14. It may be also to fully fit the cover plate 16 on the display panel 14, and then the cover plate 16 and the display screen 14 fully fitted are mounted on the top surface 1206 of the first support component 120.

In the description of this specification, the description of the terms "one embodiment," "some embodiments," "exemplary embodiment," "examples," "specific examples," or "some examples," etc., means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples.

In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

The foregoing descriptions are merely exemplary embodiments of the present disclosure, rather than limiting the present disclosure. Various modifications and alterations may be made to the present disclosure for a person skilled in the art. Any modification, equivalent substitution, improvement or the like made within the spirit and principle of the present disclosure shall fall into the protection scope of the present disclosure.

What is claimed is:

1. A display panel assembly, comprising:
   a support comprising a first support component and a second support component, the second support component comprising a bottom wall and a side wall bent from the bottom wall, a bottom surface of the first support component fixed to the bottom wall of the second support component, a side surface of the first support component facing the side wall of the second support component;
   a display panel fixed to a top surface of the first support component;
   a cover plate disposed on the display panel; and
   a decorative ring disposed on a top end of the side wall of the second support component away from the bottom wall of the second support component and joined to a side of the cover plate;
   wherein an inner wall of the decorative ring comprises a first joining surface, which extends beyond the side wall of the second support component and joins the decorative ring to the side of the cover plate;
   wherein an innermost wall of the side wall of the second support component is offset from an outermost wall of the display panel to define a gap;
   wherein the gap lies between a first plane, located along the innermost wall of the side wall of the second support component, and a second plane, located along the outermost wall of the display panel, the first joining surface lying between the first plane and the second plane;
   wherein the side of the cover plate comprises a second joining surface opposite to the first joining surface, the first joining surface and the second joining surface are inclined with respect to the side wall of the second support component.

2. The display panel assembly as claimed in claim 1, wherein an inner wall of the decorative ring comprises a first joining surface, the side of the cover plate comprises a second joining surface facing the first joining surface, and the first joining surface and the second joining surface are inclined with respect to the side wall of the support.

3. The display panel assembly as claimed in claim 1, wherein material of the support comprises metallic material.

4. The display panel assembly as claimed in claim 1, wherein material of the support comprises steel, aluminum alloy, or magnesium alloy.

5. The display panel assembly as claimed in claim 1, wherein a thickness of the first support component ranges from greater than or equal to 0.4 mm to less than or equal to 0.5 mm.

6. The display panel assembly as claimed in claim 1, wherein a thickness of the side wall of the second support component is greater than or equal to 0.2 mm to less than 0.4 mm.

7. The display panel assembly as claimed in claim 1, wherein the first support component is fixed to the bottom wall of the second support component to form the support by a method selected from the group consisting of welding, gluing, threading, and engagement.

8. The display panel assembly as claimed in claim 1, wherein the side surface of the first support component is in contact with the side wall of the second support component.

9. The display panel assembly as claimed in claim 1, wherein the decorative ring is joined to the support by an in-mold injection molding process.

10. The display panel assembly as claimed in claim 1, wherein the display panel assembly is a mobile phone, a tablet, or a smart watch.

11. The display panel assembly as claimed in claim 1, wherein an outer wall of the decorative ring has a curved arc shape.

12. The display panel assembly as claimed in claim 1, wherein material of the support is steel, a thickness of the first support component is 0.4 mm, and a thickness of the side wall is 0.2 mm.

13. The display panel assembly as claimed in claim 1, wherein material of the support is magnesium alloy, a thickness of the first support component is 0.5 mm, and a thickness of the side wall is 0.2 mm.

14. The display panel assembly as claimed in claim 1, wherein material of the decorative ring is plastic.

15. The display panel assembly as claimed in claim 1, wherein an inner wall of the decorative ring comprises a first joining surface, the side of the cover plate comprises a second joining surface facing the first joining surface, and the first joining surface and the second joining surface are inclined planes.

16. The display panel assembly as claimed in claim 15, wherein an end of the first joining surface is closer to the display panel relative to the side wall of the support.

17. The display panel assembly as claimed in claim 15, wherein the first joining surface extends beyond the side wall of the support such that there is a gap between the display panel and the side wall of the support.

18. The display panel assembly as claimed in claim 1, wherein the side wall comprises a first sub-side wall and a second sub-side wall, and in a direction from the first sub-side wall to the second sub-side wall, a width of the display panel is less than a width of the first support component.

* * * * *